(12) United States Patent
Bouton et al.

(10) Patent No.: US 8,881,090 B2
(45) Date of Patent: Nov. 4, 2014

(54) METHOD FOR FABRICATION OF AN INTEGRATED CIRCUIT IN A TECHNOLOGY REDUCED WITH RESPECT TO A NATIVE TECHNOLOGY, AND CORRESPONDING INTEGRATED CIRCUIT

(75) Inventors: Guilhem Bouton, Peynier (FR); Virginie Bidal, Fuveau (FR)

(73) Assignee: STMicroelectronics (Rousset) SAS, Rousset (FR)

( * ) Notice: Subject to any disclaimer, the term of this patent is extended or adjusted under 35 U.S.C. 154(b) by 70 days.

(21) Appl. No.: 13/618,085

(22) Filed: Sep. 14, 2012

(65) Prior Publication Data

US 2013/0181294 A1 Jul. 18, 2013

(30) Foreign Application Priority Data

Jan. 18, 2012 (FR) ...................................... 12 50506

(51) Int. Cl.
*G06F 17/50* (2006.01)
*G06F 9/455* (2006.01)

(52) U.S. Cl.
USPC ............ 716/139; 716/117; 716/122; 716/132; 716/133; 716/134; 716/135

(58) Field of Classification Search
USPC .......................... 716/119, 122, 131–135, 139
See application file for complete search history.

(56) References Cited

U.S. PATENT DOCUMENTS

| 7,802,217 | B1* | 9/2010 | Gopinath et al. ............ 716/109 |
|---|---|---|---|
| 8,127,256 | B2* | 2/2012 | Konomi ........................ 716/51 |
| 8,543,958 | B2* | 9/2013 | Chen et al. ................... 716/132 |
| 2001/0161907 | | 6/2011 | Cheng et al. |
| 2011/0161907 | A1 | 6/2011 | Cheng et al. |

OTHER PUBLICATIONS

Galop-Montoro et al., "Resizing Rules for MOS Analog-Design Reuse", IEEE Design & Test of Computers, IEEE Service Center, New York, NY, US, vol. 19, No. 2, Mar. 1, 2002, pp. 20-58, ISSN: 0740-7475, DOI: 10.1109/54.990442.
Galop-Montoro et al., "Scaling Rules Allow the Reuse of MOS Analog Design", Microelectronic Systems Education, 2001 Proceedings, 2001 International Conference on Jun. 17-18, 2001, Piscataway, NJ, USA, IEEE, pp. 8-9, XP010549145, ISBN: 978-0-7695-1156-6.

\* cited by examiner

*Primary Examiner* — Nghia Doan
(74) *Attorney, Agent, or Firm* — Allen, Dyer, Doppelt, Milbrath & Gilchrist, P.A.

(57) ABSTRACT

The technological fabrication of the integrated circuit includes a fabrication of the integrated circuit in a reduced technological version of a native technology including at least a first dimensional compensation applied to the reduced channel length and to the reduced channel width of each transistor originating from a transistor, referred to as a "minimum transistor", designed in the native technology and having in this native technology an initial channel length equal to a minimum length for the native technology and an initial channel width equal to a minimum width for the native technology. The fabrication obtains a transistor having a channel length equal, to a given precision, to the initial channel length and a channel width equal, to a given precision, to the initial channel width.

9 Claims, 8 Drawing Sheets

ΔW = Wi - Wr
ΔL = Li - Lr $Wc = Wr + \Delta W$
$Lc = Lr + \Delta L$

METHOD FOR FABRICATION OF AN INTEGRATED CIRCUIT IN A TECHNOLOGY REDUCED WITH RESPECT TO A NATIVE TECHNOLOGY, AND CORRESPONDING INTEGRATED CIRCUIT

FIELD OF THE INVENTION

The invention relates to integrated circuits, and more particularly, the fabrication of integrated circuits using a technology that is reduced with respect to a native technology.

BACKGROUND OF THE INVENTION

A technological reduction is a way to reduce the costs associated with a technological platform by minimizing the workload of the designers. Thus, a technological reduction of 10% allows a gain of around 20% in the total surface area of the chip on which the integrated circuits are fabricated. By way of example, the reduced version of the 120 nanometer CMOS technology is a 110 nanometer CMOS technology.

One conventional approach used for fabricating, using a reduced technology, an integrated circuit designed in a native technology, includes applying a uniform homothetic reduction to the reduced technological version over the whole of the integrated circuit. However, such a technique may lead, in the end, to transistors produced with performance characteristics that differ from the corresponding transistors designed in the native technology.

SUMMARY OF THE INVENTION

According to one embodiment and its implementation, an approach is to apply a technological reduction allowing transistors to be obtained with electrical performances comparable to those of the corresponding transistors designed in the native technology. This notably includes fabricating transistors with a minimum size, capable of offering similar performances in terms of speed and current, with respect to the corresponding transistors from which they originate in the native technology, and to do this without modifying the design technological platform.

According to one aspect, a method is provided for fabrication of an integrated circuit comprising a design of the integrated circuit and a technological fabrication of the integrated circuit in and/or on a substrate. According to a general feature of this aspect, the design of the integrated circuit is carried out using a library of components defined in a native technology having an associated reduced technological version. The technological fabrication comprises the fabrication of the integrated circuit in the reduced technological version. This fabrication includes at least a first dimensional compensation applied to the reduced channel length and to the reduced channel width of each transistor originating from a transistor, referred to as minimum transistor, designed in the native technology, and having in this native technology an initial channel length equal to a minimum length for the native technology, and an initial channel width equal to a minimum width for the native technology. In the end a transistor is obtained having a channel length equal, to a given precision, to the initial channel length and a channel width equal, to a given precision, to the initial channel width.

In the native technology, a minimum transistor generally has a channel length, in other words a source-drain distance under the gate, equal to the etch resolution of the technology. Thus, for a native technology of 180 nanometers, the minimum channel length of a transistor is equal to 180 nanometers. Furthermore, aside from a minimum channel length, a minimum transistor also has a minimum channel width. Thus, in the 180 nanometer technology, this minimum channel width is equal to 260 nanometers.

Thus, the dimensional compensation, in length and in width, applied to the channel of a minimum transistor, allows the same performance in terms of speed and current to be obtained as that of the corresponding minimum transistor from which the transistor produced and dimensionally compensated originates.

Each transistor comprises an electrically active region of substrate situated within the substrate and, on top of the substrate, a gate region including an electrically active gate region situated on top of the active region of substrate. And, according to one embodiment, the first dimensional compensation applied to the reduced channel length comprises a widening of the electrically active reduced gate region and the first dimensional compensation applied to the reduced channel width comprises a widening of a reduced portion of electrically active region of substrate situated under the electrically active gate region.

Aside from the dimensional compensation applied to a minimum transistor, the technological fabrication furthermore advantageously comprises a second dimensional compensation applied to the reduced channel length and to the reduced channel width of each transistor originating from a transistor different from a minimum transistor in the native technology. This leads, in the end, for each transistor produced originating from a transistor different from a minimum transistor in the native technology, to a channel length greater than its reduced length, and to a channel width greater than its reduced width.

Although it is possible, for a transistor originating from a transistor different from a minimum transistor, to apply a dimensional compensation to the reduced channel width and to the reduced channel length, to finally obtain a channel length and a channel width identical to those of the corresponding transistor in the native technology, it is preferable, notably for reasons of simplification, to apply to each transistor different from a minimum transistor, the same dimensional compensation as that which is applied to the minimum transistor. This notably avoids having to calculate a dimensional compensation for each type of transistor.

In other words, according to one embodiment in which the first dimensional compensation (applied to the minimum transistor) comprises a determination of a first correction for channel length and a first correction for channel width, the second dimensional compensation (applied to a transistor different from a minimum transistor) comprises, for each transistor originating from a transistor different from a minimum transistor in the native technology, an increase in the reduced channel length by the first correction for channel length, and an increase in the reduced channel width by the first correction for channel width.

Although a dimensional compensation applied only to the length and to the channel width is sufficient for improving the performance of the transistors in the reduced technology, it is possible, notably for reasons of mask simplification, to also apply a dimensional compensation to the remaining part of the gate region. In other words, according to one embodiment, in which each transistor comprises an electrically active region of substrate situated within the substrate and, on top of the substrate, a gate region including an electrically active gate region situated on top of the electrically active region of substrate, and a remaining region, the technological fabrication furthermore comprises a third dimensional compensation comprising an increase in the dimensions of the remaining region of the gate region.

Furthermore, to take into account any potential mask misalignments, it is preferable for the technological fabrication to furthermore comprise a widening of the electrically active region of substrate outside of the channel region.

In a manner so as to comply more readily with the distances required for the spacing between the areas for making contact and the edges of active regions for example, according to one embodiment, the technological fabrication furthermore comprises a fourth dimensional compensation applied to the regions for making contact with electrically active regions, this fourth dimensional compensation comprising a dimensional reduction of these areas for making contact, greater than the homothetic reduction corresponding to the passage from the native technology to the reduced technology.

According to another aspect, an integrated circuit is provided, fabricated in and/or on a substrate in a reduced technological version of a native technology and comprising transistors all having a channel length equal, to a given precision, to at least a minimum length for the native technology and a channel width equal, to a given precision, to at least a minimum width for the native technology.

According to one embodiment, each transistor comprises an electrically active region of substrate situated within the substrate and, on top of the substrate, a gate region including an electrically active gate region situated on top of the electrically active region of substrate, and at least some of the transistors comprise a gate region having, in the direction of the length of the channel, a larger dimension than that of the portion of gate region adjacent to the gate region, and an electrically active region of substrate having, under the gate region and in the direction of the channel width, a larger dimension than that of a portion of this region of substrate situated outside of the gate region.

According to one embodiment, at least some of the transistors comprise a gate region having, in the gate region and in a portion of gate region adjacent to the gate region, the same dimension measured in the direction of the length of the channel.

According to one embodiment, each transistor comprises a widening of the electrically active region of substrate outside of the channel region.

According to one embodiment, the circuit comprises areas for making contact with electrically active regions having a smaller surface area than that obtained by the homothetic reduction corresponding to the passage from the native technology to the reduced technology.

BRIEF DESCRIPTION OF THE DRAWINGS

Other advantages and features of the invention will become apparent upon examining the detailed description of non-limiting embodiments and their implementation, and of the appended drawings in which.

DETAILED DESCRIPTION OF THE PREFERRED EMBODIMENTS

Figure 1:
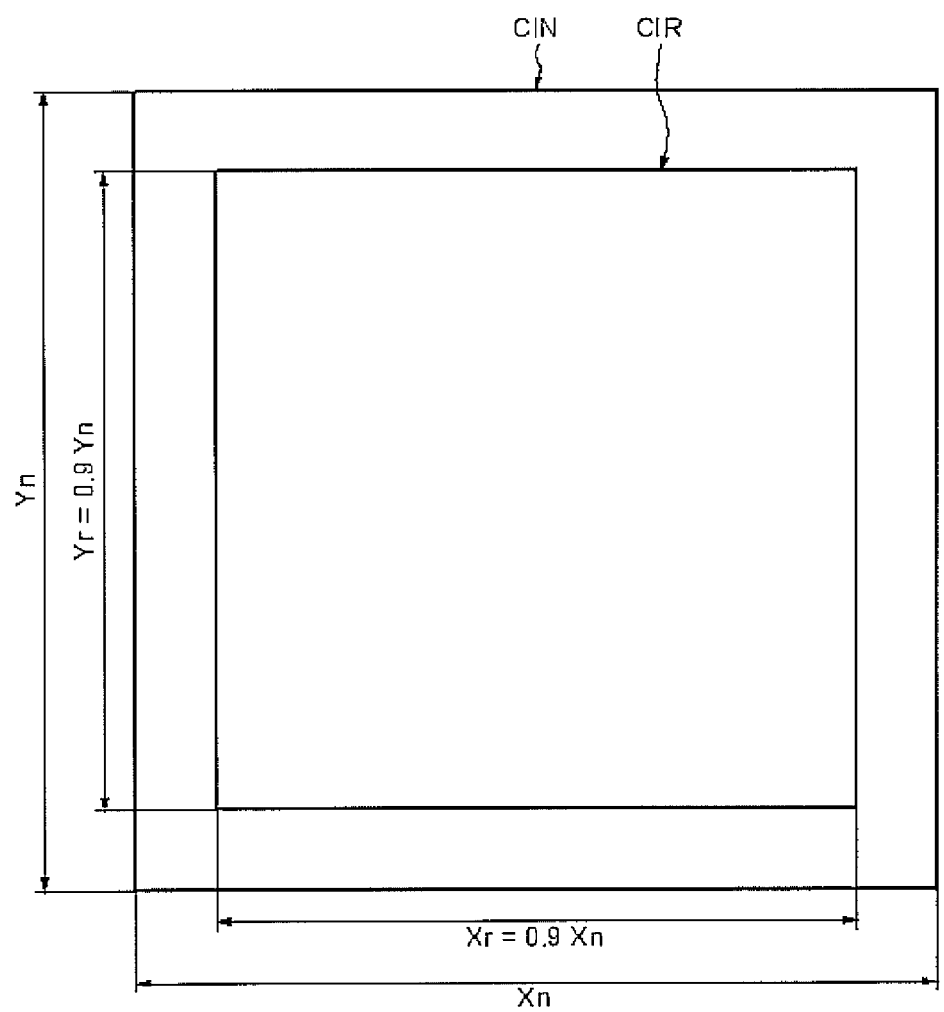
FIG. 1 is a schematic diagram illustrating an integrated circuit designed and fabricated in a native technology, and the same integrated circuit designed with components coming from the native technology, but fabricated in a technology reduced from the native technology, in accordance with features of the present invention.

In FIG. 1, the reference CIN denotes an integrated circuit designed and fabricated in a native technology, for example a 120 nanometer technology. The reference CIR denotes the same integrated circuit designed with components coming from the native technology, but fabricated in a technology reduced from the native technology, for example the 110 nanometer technology. In this respect, it can be seen that if Xn and Yn denote the dimensions in the plane of the circuit CIN, the dimensions Xr and Yr of the circuit CIR are obtained by applying a homothetic reduction of 10%, which in the end leads to a surface area occupied by the circuit CIR reduced by around 20% with respect to the surface occupied by the integrated circuit CIN.

Figure 2:
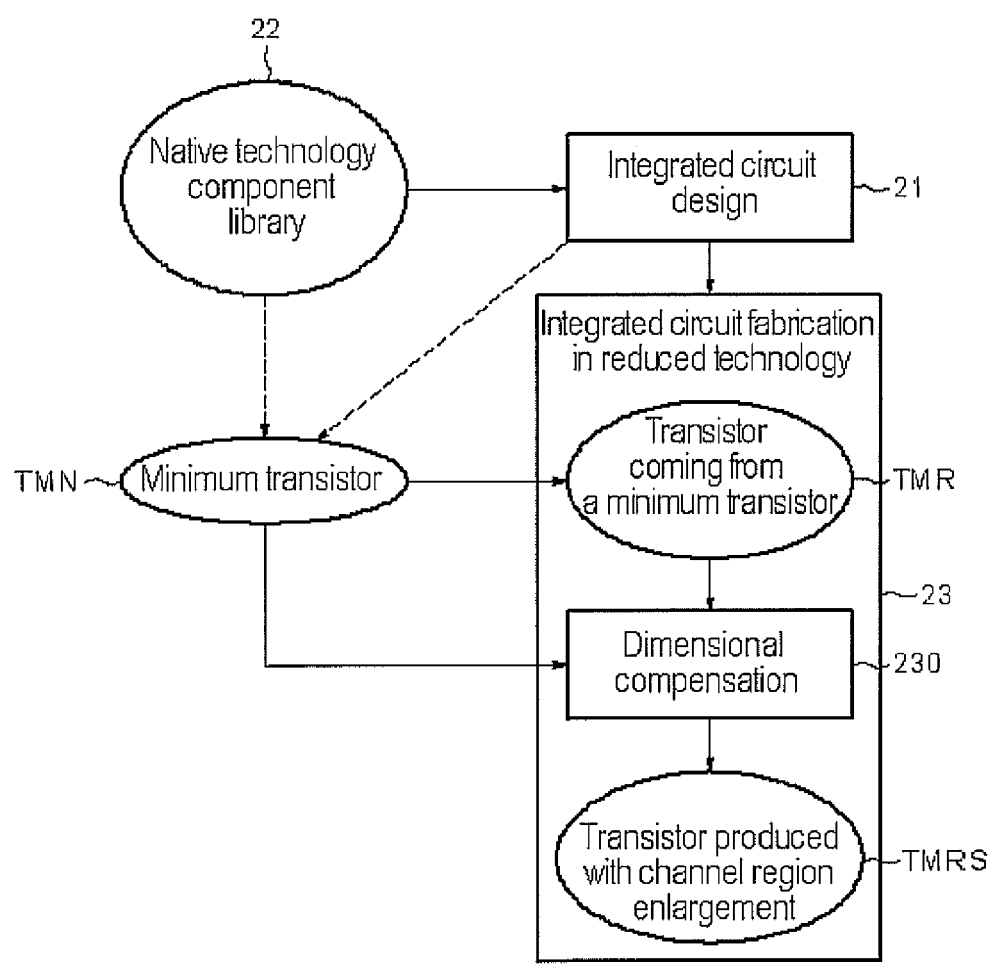
FIG. 2 is a block diagram illustrating features of the present embodiments.

However, as illustrated in FIG. 2, aside from this homothetic reduction, a dimensional compensation is carried out of at least the channel region of at least some transistors of the integrated circuit. More precisely, the design 21 of the integrated circuit is carried out using a library 22 of components defined in the native technology, this native technology having an associated reduced technological version.

In addition, the technological fabrication 23 of the integrated circuit in the reduced technology comprises at least a first dimensional compensation 230 applied to the channel region of each transistor TMR originating from a transistor, referred to as "minimum transistor", TMN in the native technology. A minimum transistor in the native technology is a transistor whose channel width W and channel length L correspond to minimum, or critical, values in the native technology. Conventionally and as is known, the minimum channel length of a minimum transistor is equal to the etch resolution in the corresponding technology.

Accordingly, owing to this dimensional compensation 230 applied to a transistor TMR, a transistor formed TMRS having an enlarged channel region is finally obtained in the integrated circuit CIR fabricated in the reduced technology. More precisely, the channel length of the transistor TMRS thus formed is equal, to a given precision, notably associated with the technological fabrication steps, to the initial channel length of the minimum transistor TMN and having a channel width equal, to a given precision, to the initial channel width of the transistor TMN.

Figure 3:
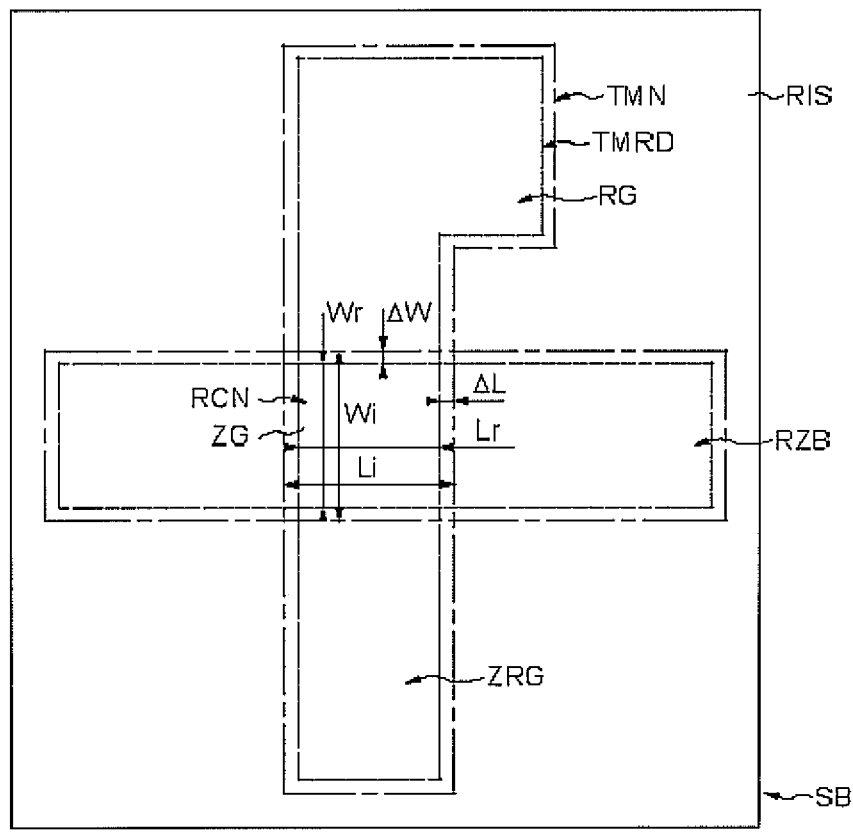
FIGS. 3 to 8 are schematic diagrams illustrating various embodiments of the invention and their implementation.

In FIG. 3, a minimum transistor TMN using the native technology is schematically shown. This transistor TMN is formed in and on a semiconductor substrate SB. This transistor TMN has, within the substrate SB, an electrically active region RZB of substrate, surrounded by an insulating region RIS, for example of the shallow trench type (STI: "Shallow Trench Isolation"). The electrically active region RZB of substrate comprises the source and drain regions of the transistor.

The transistor TMN also includes a gate region RG, for example made of polysilicon, comprising an electrically active gate region ZG on top of the region RZB of substrate. Here, the remainder of the gate region RG is more simply referred to as "remaining gate region" ZRG. This remaining gate region notably allows the contact to be made onto the gate region.

The channel region of the transistor TMN is situated under the gate region ZG, and this channel region of the transistor TMN has an initial width Wi, which is a minimum width in the native technology, and an initial length Li which is a minimum length in the native technology. By applying a homothetic reduction in such a manner as to go to the reduced technology, a reduced transistor TMRD whose channel region has a width Wr and a length Lr is then obtained. These values Wr and Lr are respectively equal to 90% of Wi and Li. The difference LW in the channel width is equal to Wi-Wr and the difference in length ΔL is equal to Li-Lr.

Figure 4:
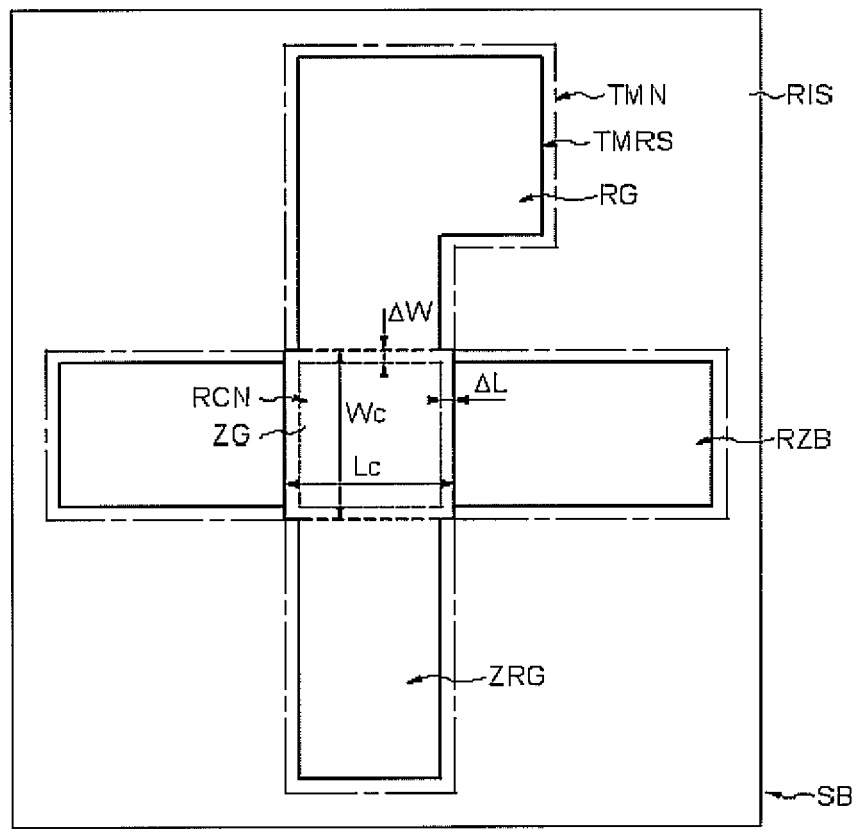

FIG. 4 illustrates the transistor TMN with a mixed dashed line and, with a solid line, the transistor TMRS finally obtained (with dimensional compensation) in the reduced technology. As explained hereinabove, the transistor TMRS differs from the transistor TMRD in FIG. 3 by the fact that the channel region RCN is dimensionally enlarged. More precisely, as illustrated in FIG. 4, the various masks are adjusted allowing the transistor TMRS to be produced such that the width Wc of the channel region RCN is equal to Wr+ΔW, and that the length Lc of the channel region RCN is equal to Lr+ΔL.

Therefore, to a given precision, the initial length and the initial width of the channel region of the minimum transistor TMN, from which the transistor TMRS originates, are recovered. The performance of the transistor TMRS, in terms notably of speed and current, are thus substantially equal to those of the corresponding transistor in the native technology.

In FIG. 4, it is noted that the dimensional compensation has only been applied to the channel region RCN. This dimensional compensation corresponds to a local widening of the region RZB, and to a local widening of the gate region ZG. However, the rest of the region of substrate RZB has not been dimensionally compensated and conserves the dimensions of the transistor TMRD. The same applies to the remaining gate region ZRG.

Figure 5:
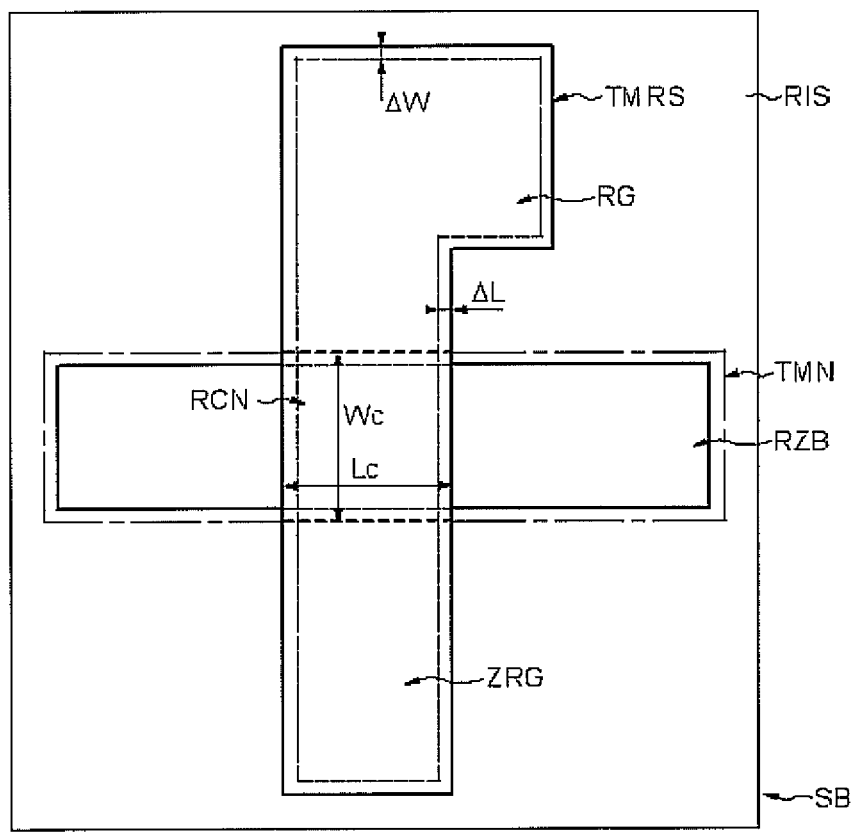

As a variant, as illustrated in FIG. 5, it is possible to also apply a dimensional compensation to the remaining gate region ZRG so as to increase its dimensions. More precisely, the dimensions of this remaining gate region ZRG are increased by ΔL and by ΔW so as to recover the dimensions of the remaining gate region of the transistor TMN. Of course, the channel length Lc and the channel width Wc are unchanged with respect to the values in FIG. 4. Such an embodiment simplifies, in particular, the fabrication of the masks.

Figure 6:
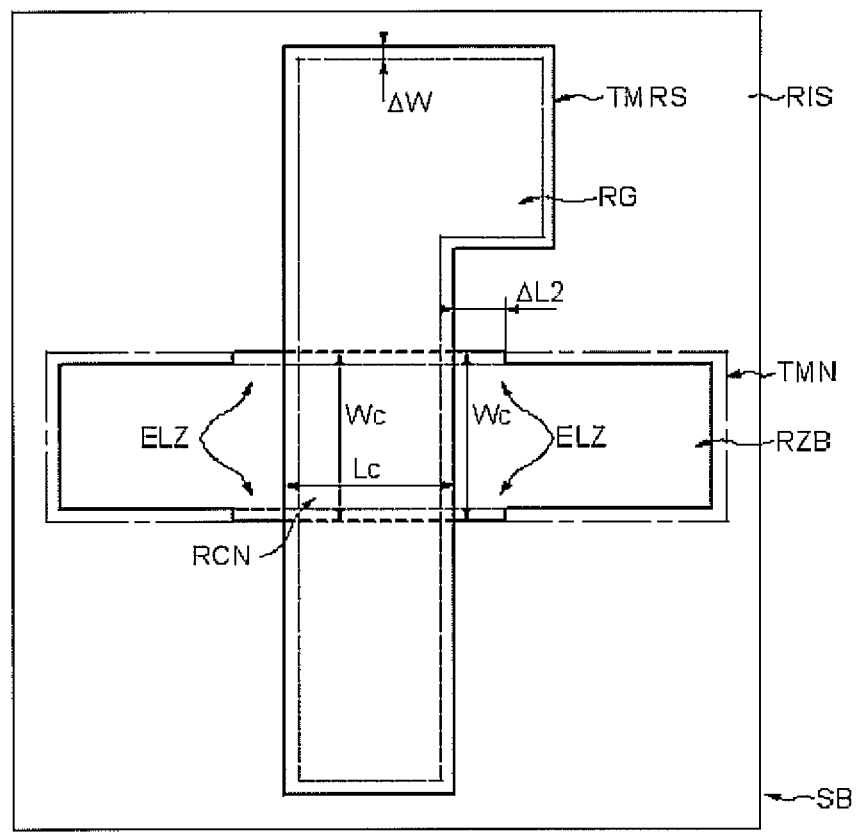

The transistor TMRS illustrated in the embodiment in FIG. 6 differs from the transistor TMRS in FIG. 5 by the electrically active region of substrate RZB exhibiting a widening ELZ outside of the channel region RCN. This widening ELZ extends over a length ΔL2 and allows any potential mask misalignments to be taken into account. Those skilled in the art will know how to adjust the value of ΔL2 according notably to the technology used. Accordingly, by way of example, for a compensated gate width of 180 nanometers, ΔL2 will for example be chosen to be around 60 nanometers Even if the dimensional compensation is as first priority applied to the minimum transistors, because it is their ratio W/L that may be the most critical with respect to the performance characteristics of the transistor, a dimensional compensation may also be applied to any other transistor different from a minimum transistor in such a manner that their performance comes close to the performance of these same transistors in the native technology.

Figure 7:
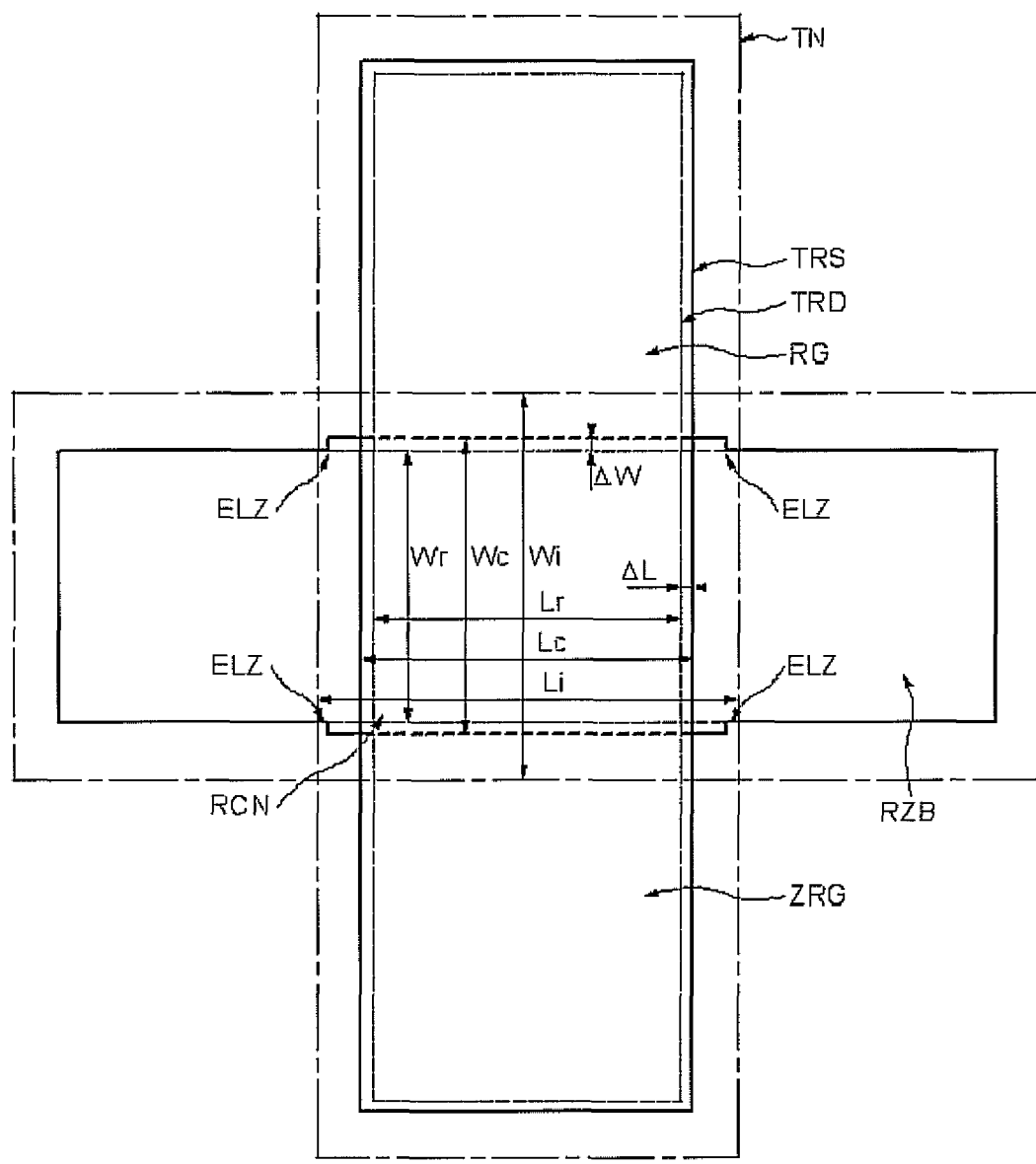

This is illustrated in FIG. 7. In this figure, the reference TN denotes a transistor designed in the native technology, the reference TRD the reduced transistor following application of the homothetic reduction factor, and the transistor TRS denotes the transistor having undergone a dimensional compensation with respect to the transistor TRD. It can be seen in this FIG. 7 that the dimensional compensation has been applied in this example not only to the channel region RCN but also to the remaining gate region ZRG with, in addition, a widening ELZ of the active region of substrate RZB outside of the channel region.

Although it is possible to calculate a specific dimensional compensation for this transistor so as to recover channel region dimensions corresponding to those of the channel region of the transistor in the native technology, it is simpler to apply, for all the transistors different from a minimum transistor, the correction for channel width ΔW and the correction for channel length ΔL calculated for a minimum transistor.

Thus, for this transistor TRS finally produced, the channel width Wc is equal to the reduced width Wr increased by the correction ΔW. Similarly, the channel length Lc is equal to the reduced length Lr increased by the length correction ΔL. For this reason, the values Wc and Lc are respectively lower than the initial values Wi and Li of the channel of the transistor TN.

Thus, the integrated circuit fabricated in and/or on the substrate SB, in the reduced technological version, comprises transistors all having a channel length equal, to a given precision, to at least a minimum length for the said native technology and a channel width equal, to a given precision, to at least a minimum width for the said native technology.

It is also possible, notably for maintaining sufficient distances between the areas for making contact and the edges of active regions for example, for the integrated circuit to comprise areas for making contact with electrically active regions having a smaller surface area than that obtained by the homothetic reduction corresponding to the passage from the native technology to the reduced technology.

Figure 8:
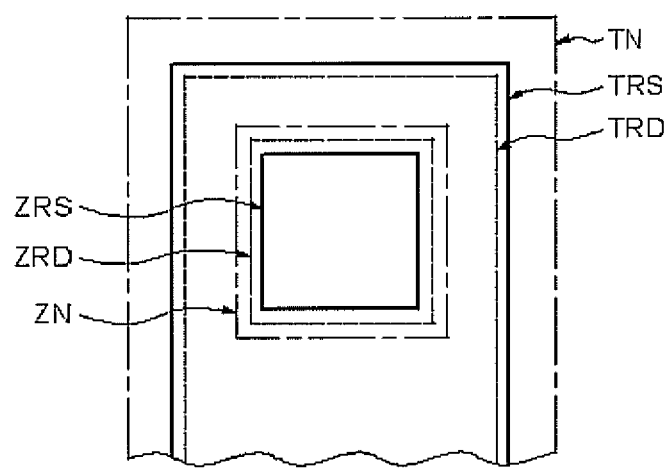

This is illustrated schematically in FIG. 8. In this figure, the reference TN denotes a transistor in the native technology, the reference TRD the reduced transistor following application of the homothetic reduction factor and the reference TRS denotes the transistor finally obtained in the reduced technology. The reference ZN denotes an area for making contact, for example a silicided region, in the native technology, the reference ZRD denotes this same area for making contact following application of the homothetic reduction factor and the reference ZRS denotes the zone of contact area finally formed for the transistor TRS.

It can therefore be seen that this area ZRS has a smaller surface area than the area ZRD. Thus, for example, in a native CMOS 0.18 micron technology, the region ZN has a size of 160 nanometers. Following application of a homothetic reduction factor of 10% so as to take it into the reduced technology, the contact area ZRD would have a size of length 144 nanometers. However, the size of the area ZRS finally formed is 120 nanometers.

Obtaining the mask files for each level of integrated circuit is carried out in a manner that is conventional and known per se. More precisely, during the design, the integrated circuit is, as has been indicated hereinabove, built from a library of components defined in the native technology. In a manner that is conventional and known per se, an initial file is thus generated, for example a file in the GDSII format, representative of the electronic structure of the integrated circuit. This initial file is for example obtained with conventional design tools such as those marketed by the U.S. company CADENCE.

Starting from the initial file, a second file is then generated, for example also in a GDSII format, representative of the contents of all the levels of the integrated circuit, and this is in the reduced technology with the various aforementioned dimensional compensations. The data of this second file represent mask data before dimensional correction, linear or of the OPC type, and are obtained in a conventional manner from the initial file by a conventional and known conversion tool, for example a tool marketed by the company MENTOR GRAPHICS under the name "calibre". In this respect, the calibre tool is set up so as to apply during this operation a homothetic reduction factor of 0.9 to go from the native technology to the reduced technology and so as to also apply the various aforementioned dimensional compensations.

Then, conventional post-processing operations are applied to this second file notably comprising optical proximity corrections (OPC). Lastly, final masks files are obtained for each integrated circuit level. The integrated circuit is subsequently fabricated in a conventional manner using physical masks written by the mask supplier with the final mask files.

That which is claimed:

1. A method for fabricating an integrated circuit, the method comprising:
   providing an integrated circuit design using a library of components defined in a native technology and having an associated reduced technological version; and
   fabricating the integrated circuit on a substrate, in the reduced technological version including at least a first dimensional compensation applied to a reduced channel length and to a reduced channel width for each transistor originating from a minimum transistor defined in the native technology by an initial channel length equal to a minimum length for the native technology and an initial channel width equal to a minimum width for the native technology, so as to obtain each transistor with a channel length equal, within a given tolerance, to the initial channel length and a channel width equal, within a given tolerance, to the initial channel width;
   wherein each transistor comprises an electrically active region within the substrate and a gate region including an electrically active gate region above of the electrically active region, and the first dimensional compensation applied to the reduced channel length comprises a widening of a reduced electrically active gate region, and the first dimensional compensation applied to the reduced channel width comprises a widening of a reduced portion of the electrically active region below the electrically active gate region.

2. The method according to claim 1, wherein fabricating further comprises a second dimensional compensation applied to the reduced channel length and to the reduced channel width of each second transistor, not originating from the minimum transistor in the native technology, resulting in each second transistor having a channel length greater than its reduced channel length and to a channel width greater than its reduced channel width.

3. The method according to claim 2, wherein the first dimensional compensation comprises a determination of a first correction for channel length and of a first correction for channel width, and the second dimensional compensation comprises for each second transistor, an increase in the reduced channel length by the first correction for channel length and an increase in the reduced channel width by the first correction for channel width.

4. The method according to claim 1, wherein the gate region includes a remaining region; and wherein the fabricating further comprises a third dimensional compensation comprising an increase in dimensions of the remaining region of the gate region.

5. The method according to claim 4, wherein the fabricating further comprises a fourth dimensional compensation applied to areas for making contact with electrically active regions and comprising a dimensional reduction of these areas for making contact greater than the reduction between the native technology and the associated reduced technological version.

6. The method according to claim 1, wherein the fabricating comprises a widening of the electrically active region outside of the channel region.

7. A method for fabricating an integrated circuit, the method comprising:
   providing an integrated circuit design based upon components in a native technology and having an associated reduced technological version; and
   fabricating the integrated circuit on a substrate, in the reduced technological version including a first dimensional compensation applied to a reduced channel length and to a reduced channel width for each first transistor defined in the native technology by an initial channel length equal to a key length for the native technology and an initial channel width equal to a key width for the native technology, so as to obtain each transistor with a channel length equal to the initial channel length, and a channel width equal to the initial channel width;
   wherein each transistor comprises an electrically active region within the substrate and a gate region including an electrically active gate region above of the electrically active region, and the first dimensional compensation applied to the reduced channel length comprises a widening of a reduced electrically active gate region, and the first dimensional compensation applied to the reduced channel width comprises a widening of a reduced portion of the electrically active region below the electrically active gate region.

8. The method according to claim 7, wherein fabricating further comprises a second dimensional compensation applied to the reduced channel length and to the reduced channel width of each second transistor, not defined in the native technology, resulting in each second transistor having a channel length greater than its reduced channel length and to a channel width greater than its reduced channel width.

9. The method according to claim 8, wherein the first dimensional compensation comprises a determination of a first correction for channel length and of a first correction for channel width, and the second dimensional compensation comprises for each second transistor, an increase in the reduced channel length by the first correction for channel length and an increase in the reduced channel width by the first correction for channel width.

* * * * *

UNITED STATES PATENT AND TRADEMARK OFFICE
CERTIFICATE OF CORRECTION

PATENT NO. : 8,881,090 B2  
APPLICATION NO. : 13/618085  
DATED : November 4, 2014  
INVENTOR(S) : Bouton et al.

Page 1 of 1

It is certified that error appears in the above-identified patent and that said Letters Patent is hereby corrected as shown below:

In the Claims

Claim 1, Column 7, Line 33        Delete: "above of the"  
                                  Insert: --above the--

Claim 7, Column 8, Line 33        Delete: "above of the"  
                                  Insert: --above the--

Signed and Sealed this  
Twenty-first Day of July, 2015

Michelle K. Lee  
*Director of the United States Patent and Trademark Office*